United States Patent
Vogan et al.

(10) Patent No.: US 9,891,859 B1
(45) Date of Patent: Feb. 13, 2018

(54) SYSTEMS AND METHODS FOR MANAGING NON-VOLATILE MEMORY BASED ON TEMPERATURE

(71) Applicant: Apple Inc., Cupertino, CA (US)

(72) Inventors: Andrew W. Vogan, Gilroy, CA (US); Charan Srinivasan, San Jose, CA (US); Matthew J. Byom, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/232,253

(22) Filed: Aug. 9, 2016

(51) Int. Cl.
*G11C 7/04* (2006.01)
*G06F 3/06* (2006.01)

(52) U.S. Cl.
CPC .......... *G06F 3/0647* (2013.01); *G06F 3/0619* (2013.01); *G06F 3/0653* (2013.01); *G06F 3/0679* (2013.01)

(58) Field of Classification Search
CPC .......... G11C 7/04; G11C 16/10; G11C 13/004
See application file for complete search history.

(56) References Cited

U.S. PATENT DOCUMENTS

| | | | |
|---|---|---|---|
| 9,165,668 B1 * | 10/2015 | Zhao | G11C 16/3418 |
| 9,668,337 B2 * | 5/2017 | Stoev | H05K 1/0212 |
| 9,672,940 B1 * | 6/2017 | Reusswig | G11C 16/10 |
| 2006/0279990 A1 * | 12/2006 | Wan | G11C 16/3418 365/185.17 |
| 2014/0126292 A1 * | 5/2014 | Yang | G11C 7/04 365/185.18 |
| 2016/0180946 A1 * | 6/2016 | Hong | G11C 16/26 365/185.11 |

* cited by examiner

*Primary Examiner* — Tuan T Nguyen
(74) *Attorney, Agent, or Firm* — Van Court & Aldridge LLP

(57) ABSTRACT

Systems and methods for managing data in non-volatile memory devices across a large range of operating temperatures are provided. Embodiments discussed herein selectively reprogram previously programmed data at a temperature that better enables the data to be read regardless of where within the range of operating temperatures the data is being read. Circuitry and methods discussed herein can keep track of a program temperature associated with each portion of non-volatile memory and use this information along with other criteria to selectively perform temperature based moves of data. This enables a mechanism for data to programmed in out-of-bounds temperature ranges to be reprogrammed within an in-bounds temperatures range so that a temperature delta between the reprogrammed temperature and the read operation temperature is below a threshold that ensure efficient and error free read operations to be performed.

19 Claims, 5 Drawing Sheets

SYSTEMS AND METHODS FOR MANAGING NON-VOLATILE MEMORY BASED ON TEMPERATURE

TECHNICAL FIELD

This patent specification generally relates to non-volatile memory devices, and more particularly, to managing non-volatile memory based on temperature.

BACKGROUND

Various types of non-volatile memory ("NVM"), such as flash memory (e.g., NAND flash memory and NOR flash memory), can be used for mass storage. For example, consumer electronics (e.g., portable media players) use flash memory to store data, including music, videos, images, and other types of information. The NVM is expected to reliably retain data across a range of operating temperatures. However, NVM data retention tends to decrease as lithography design rules evolve and shrink. Usage, time, and temperature of the NVM also tend to adversely affect data retention.

SUMMARY

Systems and methods for managing data in non-volatile memory devices across a large range of operating temperatures are provided. Embodiments discussed herein selectively reprogram previously programmed data at a temperature that better enables the data to be read regardless of where within the range of operating temperatures the data is being read. Circuitry and methods discussed herein can keep track of a program temperature associated with each programmed portion of non-volatile memory and use this information along with other criteria to selectively perform temperature based moves of data. This enables a mechanism for data to programmed in out-of-bounds temperature ranges to be reprogrammed within an in-bounds temperature range so that a temperature delta between the reprogrammed temperature and the read operation temperature is below a threshold that ensures efficient and error free read operations to be performed.

In one embodiment, a system including non-volatile memory, a temperature sensor; and control circuitry is provided. The control circuitry is configured to receive instruction to program data into a band of the non-volatile memory, wherein in response to the received instruction, the control circuitry is configured to open the band, receive a temperature value from the temperature sensor, wherein the temperature value is classified as one of an in-bounds temperature and an out-of-bounds temperature program the data and the temperature value into the band, and close the band. The control circuitry is configured to perform temperature-based moves of previously programmed bands when the temperature sensor indicates the temperature value is within the in-bounds temperature, wherein the temperature-based moves include: determine which previously programmed bands were programmed at the out-of-bounds temperature, and reprogram the previously programmed bands determined to be programmed at the out-of-bounds temperature into new bands while the temperature value is within the in-bounds temperature.

In another embodiment, a method for managing temperature-based moves of data stored in non-volatile memory is provided. The method can include receiving a current temperature value from at least one temperature sensor, programming data into a first band of the non-volatile memory, programming the current temperature value as a program temperature into metadata associated with the first band, and selectively reprogramming the data stored in the first band to a second band of the non-volatile memory if performance based criteria are satisfied, wherein the data stored in the second band is programmed at a temperature that provides enhanced temperature swing tolerance than the data stored in the first band.

In yet another embodiment, a method is provided for managing temperature based moves of data stored in three-dimensional non-volatile memory (NVM), the method implemented in a device that is subjected to temperature swings that can affect read performance. The method can include monitoring a current temperature, programming a plurality NVM portions with data, wherein each NVM portion includes metadata specifying a program temperature into a first band of the non-volatile memory, wherein the program temperature is classified as one of an in-bounds temperature and an out-of-bounds temperature, determining which of the plurality of NVM portions were programmed at the out-of-bounds temperature, and reprogramming the NVM portions determined to have been previously programmed at the out-of-bounds temperature into new bands while the current temperature is within the in-bounds temperature.

A further understanding of the nature and advantages of the embodiments discussed herein may be realized by reference to the remaining portions of the specification and the drawings.

DETAILED DESCRIPTION

In the following detailed description, for purposes of explanation, numerous specific details are set forth to provide a thorough understanding of the various embodiments described herein. Those of ordinary skill in the art will realize that these various embodiments are illustrative only and are not intended to be limiting in any way. Other embodiments will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual embodiment, numerous embodiment-specific decisions may be required to achieve specific design objectives. These design objectives will vary from one embodiment to another and from one developer to another. Moreover, it will be appreciated that such a development effort might be complex and time-consuming, but would nevertheless be a routine engineering undertaking for those of ordinary skill in the art having the benefit of this disclosure.

Figure 1:
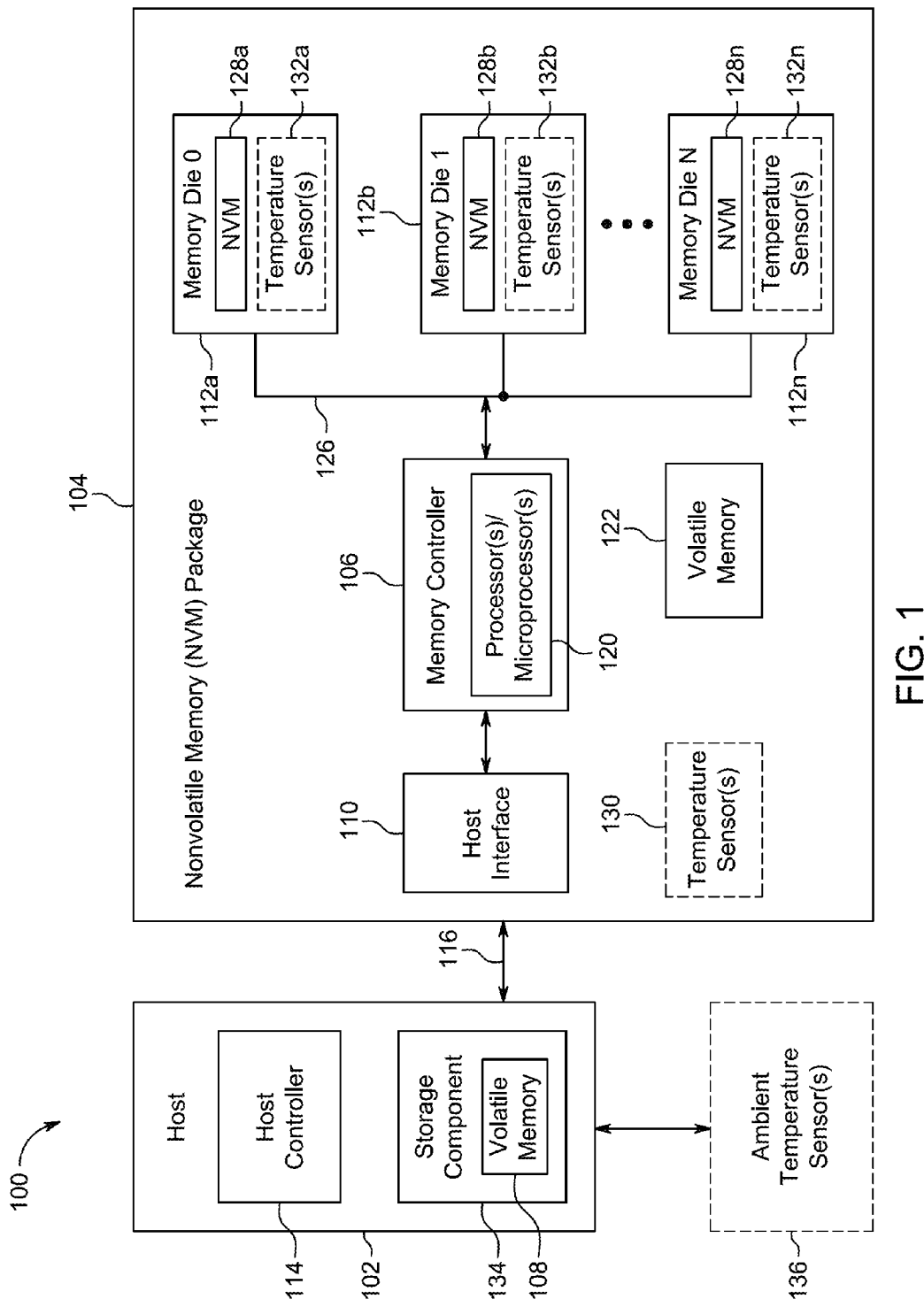
FIG. 1 is a diagram depicting an illustrative system that includes a host and an NVM package with a memory controller, according to various embodiments.

FIG. 1 is a diagram depicting system 100, including NVM package 104 and host 102. Host 102 may be configured to provide memory access requests (e.g., read, write, and erase commands) to NVM package 104, which can include memory controller 106, host interface 110, and NVM dies 112 a-n with corresponding NVMs 128 a-n.

Host 102 can be any of a variety of host devices and/or systems, such as a portable media player, a cellular telephone, a pocket-sized personal computer, a personal digital assistant ("PDA"), a desktop computer, a laptop computer, and/or a tablet computing device. NVM package 104 can include NVMs 128 a-n (e.g., in NVM dies 112 a-n) and can be a ball grid array package or other suitable type of integrated circuit ("IC") package. NVM package 104 can be part of and/or separate from host 102. For example, host 102 can be a board-level device and NVM package 104 can be a memory subsystem that is installed on the board-level device. In other embodiments, NVM package 104 can be coupled to host 102 with a wired (e.g., SATA) or wireless (e.g., Bluetooth™) interface.

Host 102 can include host controller 114 that is configured to interact with NVM package 104. For example, host 102 can transmit various access requests, such as read, write, and erase commands, to NVM package 104. Host controller 114 can include one or more processors and/or microprocessors that are configured to perform operations based on the execution of software and/or firmware instructions. Additionally or alternatively, host controller 114 can include hardware-based components, such as application-specific integrated circuits ("ASICs"), that are configured to perform various operations. Host controller 114 can format information (e.g., commands and/or data) transmitted to NVM package 104 according to a communications protocol shared between host 102 and NVM package 104.

Host controller 114 can obtain temperature measurements for system 100 from one or more ambient temperature sensors 136. Temperature sensor 136 is depicted in FIG. 1 as a dashed box to illustrate that it can be located in any suitable location, such as, for example, on a board and/or affixed to a housing of system 100. Ambient temperature sensors 136 may be used by host controller 114 (or other component of system 100) to determine the external temperature of the host.

Host 102 can include volatile memory 108. Volatile memory 108 can be any of a variety of volatile memory types, such as cache memory or RAM. Host 102 can use volatile memory 108 to perform memory operations and/or to temporarily store data that is being read from and/or written to NVM package 104. For example, volatile memory 108 can temporarily store a set of access requests to be sent to, or to store data received from, NVM package 104.

Host 102 can communicate with NVM package 104 over communications channel 116 using host interface 110 and memory controller 106. Communications channel 116 can be any bus suitable for bidirectional communications. Communications channel 116 can be fixed, detachable, or wireless. Communications channel 116 can be, for example, a universal serial bus (USB), serial advanced technology (SATA) bus, or any other suitable bus.

Memory controller 106 can include one or more processors and/or microprocessors 120 that are configured to perform operations based on the execution of software and/or firmware instructions. Additionally or alternatively, memory controller 106 can include hardware-based components, such as ASICs, that are configured to perform various operations. Memory controller 106 can perform a variety of operations, such as dispatching commands issued by host 102.

Host controller 114 and memory controller 106, alone or in combination, can perform various memory management functions, such as garbage collection and wear leveling. In implementations where memory controller 106 is configured to perform at least some memory management functions, NVM package 104 can be termed "managed NVM" (or "managed NAND" for NAND flash memory). This can be in contrast to "raw NVM" (or "raw NAND" for NAND flash memory), in which host controller 114, external to NVM package 104, performs memory management functions for NVM package 104.

In some embodiments, host controller 114 and memory controller 106 can be part of the same memory device. Although there can be overlap, host controller 114 and memory controller 106 can perform different roles. For example, host controller 114 may perform and provide user-facing functionality for the memory device, such as performing operations to provide a user interface and responding to user input (e.g., requests to play a particular media file). Memory controller 106 may perform and provide memory-based functionality for the memory device, such as implementing memory access requests from host controller 114 (e.g., converting from logical to physical addressing), performing memory management operations, and/or performing ECC operations.

As depicted in FIG. 1, memory controller 106 can be incorporated into the same package as NVM dies 112 a-n. In other embodiments, memory controller 106 may be physically located in a separate package or in the same package as host 102. In some embodiments, memory controller 106 may be omitted, and all memory management functions that are normally performed by memory controller 106 (e.g., garbage collection and wear leveling) can be performed by a host controller (e.g., host controller 114). Memory controller 106 or host 102 can include a flash translation layer (FTL) for maintaining a logical-to-physical mapping.

NVM package 104 may include volatile memory 122. Volatile memory 122 can be any of a variety of volatile memory types, such as cache memory or RAM. Memory controller 106 can use volatile memory 122 to perform access requests and/or to temporarily store data that is being read from and/or written to NVMs 128 a-n in NVM dies 112 a-n. For example, volatile memory 122 can store firmware and memory controller 106 can use the firmware to perform operations on NVM package 104 (e.g., read/program operations). In some embodiments, volatile memory 122 can be included within memory controller 106.

Memory controller 106 can obtain temperature measurements for NVM package 104 from one or more temperature sensors 130. Temperature sensor 130 is depicted in FIG. 1 as a dashed box to illustrate that it can be located in any suitable location, such as, for example, on a board, within memory controller 106, and/or affixed to the packaging of NVM package 104. Temperature sensors 130 may be used by memory controller 106 (or other component of system 100) to determine the environmental temperature of NVM package 104.

Memory controller 106 can use shared internal bus 126 to access NVMs 128 a-n and can use NVMs 128 a-n to persistently store a variety of information, such as debug logs, instructions, and firmware that NVM package 104 uses to operate. Although only one shared internal bus 126 is depicted in NVM package 104, an NVM package can include more than one shared internal bus. Each internal bus can be connected to multiple (e.g., 2, 3, 4, 8, 32, etc.) memory dies as depicted with regard to NVM dies 112 a-n. NVM dies 112 a-n can be physically arranged in a variety of configurations, including a stacked configuration, and may be, according to some embodiments, integrated circuit ("IC") dies.

NVMs 128 a-n can be any of a variety of NVM, such as NAND flash memory based on floating gate or charge trapping technology, NOR flash memory, erasable programmable read only memory ("EPROM"), electrically erasable programmable read only memory ("EEPROM"), ferroelectric RAM ("FRAM"), magnetoresistive RAM ("MRAM"), phase change memory ("PCM"), or any combination thereof. In one embodiment, NVMS 128a-n can be three-dimensional (3D) Nand. 3D Nand improves on regular two-dimensional storage by stacking storage cells in increase capacity through higher density, lower cost per gigabyte, and provides reliability, speed, and performance expected of solid-state memory. The increased density, however, can make the 3D Nand more susceptible to data loss during temperature swings, especially for cells programmed in multi-cell (MLC) mode. As 3D Nand continues to scale, string currents can be expected to degrade, and it is the temperature dependence of the string current that causes susceptibility to data loss. MLC refers to programming multiple bits per sell, whereas single cell mode (SLC) refers to programming one bit per cell.

NVMs 128 a-n can be organized into "blocks", which can the smallest erasable unit, and further organized into "pages", which can be the smallest unit that can be programmed or read. In some embodiments, NVMs 128 a-n can include multiple integrated circuits, where each integrated circuit may have multiple blocks. Memory locations (e.g., blocks or pages of blocks) from corresponding integrated circuits may form "super blocks". Each memory location (e.g., page or block) of NVMs 128 a-n can be referenced using a physical address (e.g., a physical page address or physical block address). Memory locations (e.g., blocks or pages of blocks) from corresponding integrated circuits may be logically grouped together to form "bands". Bands can provide operational parallelism, thereby enabling programming, reading, and erase operations to be performed in parallel for blocks located on different integrated circuits. Each memory location of NVMs 128a-n can be referenced using a physical address (e.g., a physical page address or physical block address).

NVM dies 112 a-n can also each include one or more temperature sensors 132 a-n located in and/or around NVMs 128 a-n. Temperature sensors 132 a-n are depicted in FIG. 1 as dashed boxes to illustrate that they can be located in any suitable location, such as, for example, spaced throughout the die to provide temperature measurements corresponding to NVMs 128 a-n. The temperature measurements from temperature sensors 132 a-n can be provided to memory controller 106 over shared internal bus 126 and/or one or more other internal channels (not shown) between NVM dies 112 a-n and memory controller 106. The temperature measurements from temperature sensors 132 a-n may be used to determine the temperature of a portion of NVM. This temperature information may be used in a variety of ways. For example, temperature information may be to determine whether perform temperature based moves.

Temperature data may indicate the temperature of various portions of NVM dies 112 a-n, such as NVMs 128 a-n, and/or the individual blocks, pages, and/or memory cells thereof. In particular, depending on the location and placement of temperature sensors 132 a-n, any suitable degree of granularity in the temperature measurements may be achieved. For example, a larger number of temperature sensors within each one of NVM dies 112 a-n may allow for the collection of more detailed temperature data about portions of NVMs 128 a-n. In some embodiments, temperature data about a particular portion of NVMs 128 a-n may be inferred from data read from a number of temperature sensors 132 a-n. Temperature data from temperature sensors 132 a-n may be read at any suitable interval including continuously, intermittently, and/or upon the occurrence of a predetermined event (e.g., a read, program, or erase operation).

According to some embodiments, the temperature data collected from temperature sensors 132 a-n may be used to form a temperature profile for NVMs 128 a-n and/or any suitable portion of NVMs 128 a-n. As used herein, a "temperature profile" can refer to a series of temperature readings for at least a portion of an NVM taken over a period of time. For example, a system-wide temperature profile may be formed for NVM package 104 as a whole. Alternatively or additionally, separate temperature profiles may be formed for portions of NVMs 128 a-n with any suitable granularity. For instance, separate temperature profiles may be stored for portions of NVMs 128 a-n corresponding to each of NVM dies 112 a-n, each block within NVMs 128 a-n, each page within NVMs 128 a-n, each memory cell within NVMs 128 a-n, and/or any combination thereof.

NVMs 128 a-n may store metadata associated with the NVM. The metadata may include information that describes the data stored in NVMs 128 a-n of NVM package 104. For example, the metadata can include temperature information that indicates a temperature of a portion of NVMs 128 a-n over a period of time. The metadata may also include a variety of additional information such as timestamp information (e.g., the time at which a memory cell was last programmed) and wear information (e.g., information indicating the number of times various portions of NVM have been programmed and/or erased). In some embodiments, the metadata may store a composite index value incorporating temperature information, timestamp information, and/or wear information based upon a predictive data retention model, discussed in more detail below.

In some embodiments, metadata associated with NVMs 128 a-n, including temperature information, timestamp information, wear information, and/or various index values, may be stored in page or block headers (e.g., portions of each page or block that can be dedicated to storing metadata). Storing this metadata in page and/or block headers may be appropriate as cycle counts, time elapsed, and temperature profiles may be localized factors specific to each block and/or page. Additionally or alternatively, this metadata may be stored in a separate table that can be easily accessed by memory controller 106 and/or host controller 114 to make temperature based move decisions. For example, during operation a table including metadata may be stored in volatile memory 122 and/or volatile memory 108.

Figure 2:
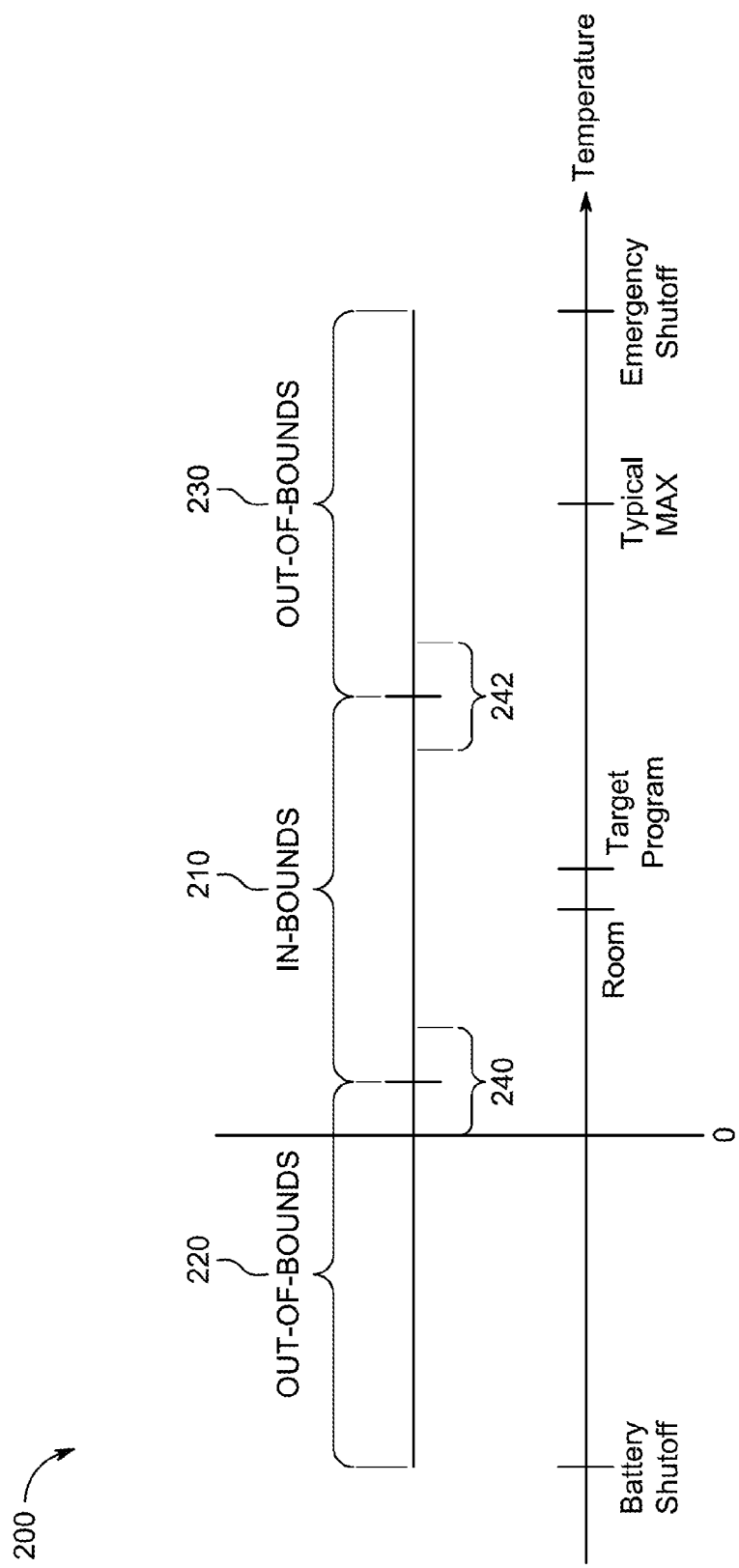
FIG. 2 shows an illustrative temperature chart of a device, according to an embodiment.

FIG. 2 shows an illustrative temperature chart 200 of a device, in accordance with an embodiment. Chart 200 shows temperatures along the x-axis and includes different temperature milestones that may be affiliated with the device. For example, the temperature may range from a battery shutoff temperature, zero degrees, room temperature, typical maximum operating temperature, and emergency shutoff temperature. During operation of a device, operations such as program, read, and erase may take place anywhere within the battery shutoff and emergency shutoff temperatures. For example, the device may be sitting on a desk and can be operating at or near room temperature, and the user may place the device in his pocket, which may cause the temperature of the device to rise to a higher temperature. If the user were to place the device on the dashboard of a car during a hot summer day, the device may be subjected to max operating temperature or higher. Conversely, if the user goes ice fishing, the device may operate at a substantially lower temperature. Thus, the temperature may swing from one end of the temperature spectrum to the other, or may vacillate anywhere in between the end spectrums, and as a result, operations may take place at different temperatures. Embodiments discussed herein provide systems and methods for handling NVM operations that have taken place over relatively large temperature swings.

The temperature at which operations are performed can be classified as an in-bounds temperature or an out-of-bounds temperature. FIG. 2 shows in-bounds temperature range 210, first out-of-bounds temperature range 220, and second out-of-bounds temperature range 230. First and second out-of-bounds temperature ranges 220 and 230 may bookend in-bounds temperature range 210. In-bounds temperature range 210 may represent an ideal or preferred temperature range in which NVM operations (e.g., program, read, and erase operations) are performed. For example, in-bound temperature range 210 may be centered with respect to target program temperature, as shown in the x-axis. That is, if the target temperature is X, the upper end of range 210 may be X+Y, and the lower end of range 210 may be X−Y, where X and Y are real numbers. In addition, in-bounds temperature range 210 represents a range of temperatures in which data can be programmed into the NVM and still accurately be read even if the read operation is performed at an out-of-bounds temperature range. For example, if a band is programmed at a temperature within in-bounds temperature range 210, a read operation can be successfully completed if the read operation is performed at the first out-of-bounds temperature range 220, in-bound temperature range 210, and second out-of-bounds temperature range 230. Thus, when a band or portion of NVM is programmed at a temperature within in-bounds temperature range 210, that same band or portion can be successfully read even if the read operation is performed at a temperature that crossed out of in-bound temperature range 210.

Out-of-bounds temperature ranges 220 and 230 may represent a range of temperatures in which data may be programmed into the NVM, but may experience errors if read at a temperature other than the range it was originally programmed. For example, if a band is programmed at a temperature within first out-of-bounds temperature range 220, an error may be experienced if that same band is read at a temperature within second out-of-bounds temperature 230. Programming data in first out-of-bounds range 220 and reading that same data out in second out-of-bounds range 230 represents a cross-temperature change that exceeds the temperature span of in-bounds temperature range 210. Such a cross-temperature change may be too large for error correction circuitry and methods to compensate for and correct. An error may also occur if a read operation is performed at an in-bounds temperature range 210 if the data was programmed at either of the out-of-bounds temperature ranges 220 or 230, but the likelihood of an uncorrectable error occurring as a result of an out-of-bounds to in-bounds cross temperature change is not as high as first out-of-bounds to second out-of-bounds, or second out-of-bounds to first out-of-bounds, cross temperature change.

The actual values assigned to in-bounds temperature range 210 and first and second out-of-bounds temperature ranges 220 and 230 may be selected based on any number of suitable criteria. In one embodiment, the values can be based on the type of device using the embodiments discussed herein. In another embodiment, the values can be updated over time (e.g., via software updates) as data is collected and analyzed. In yet another embodiment, the device itself may self-adjust its values based on monitored local factors. For example, the device may determine that program events almost never occur within first out-of-bounds temperature range 220, and thus may readjust the values for the in-bound and out-of-bound ranges to better accommodate the operating temperature ranges of the device.

Embodiments discussed herein eliminate cross-temperature deltas that exceed a maximum magnitude by selectively moving data programmed at an out-of-bounds temperature to a new band or NVM portion when the re-programming of that data can be done at an in-bounds temperature. Such temperature based moving of data can ensure that the data can be read regardless of the temperature swings experienced by the device. For example, by moving data that was programmed in second out-of-bounds temperature range 230 (or in first out-of-bounds temperature range 220) to a new location such that it is programmed within inbounds temperature range 210, the move can eliminate the possibility of a read operation that would otherwise have a cross-temperature delta that exceeds the maximum magnitude (e.g., delta spanning from range 230 to range 220, or vice versa).

Figure 3:
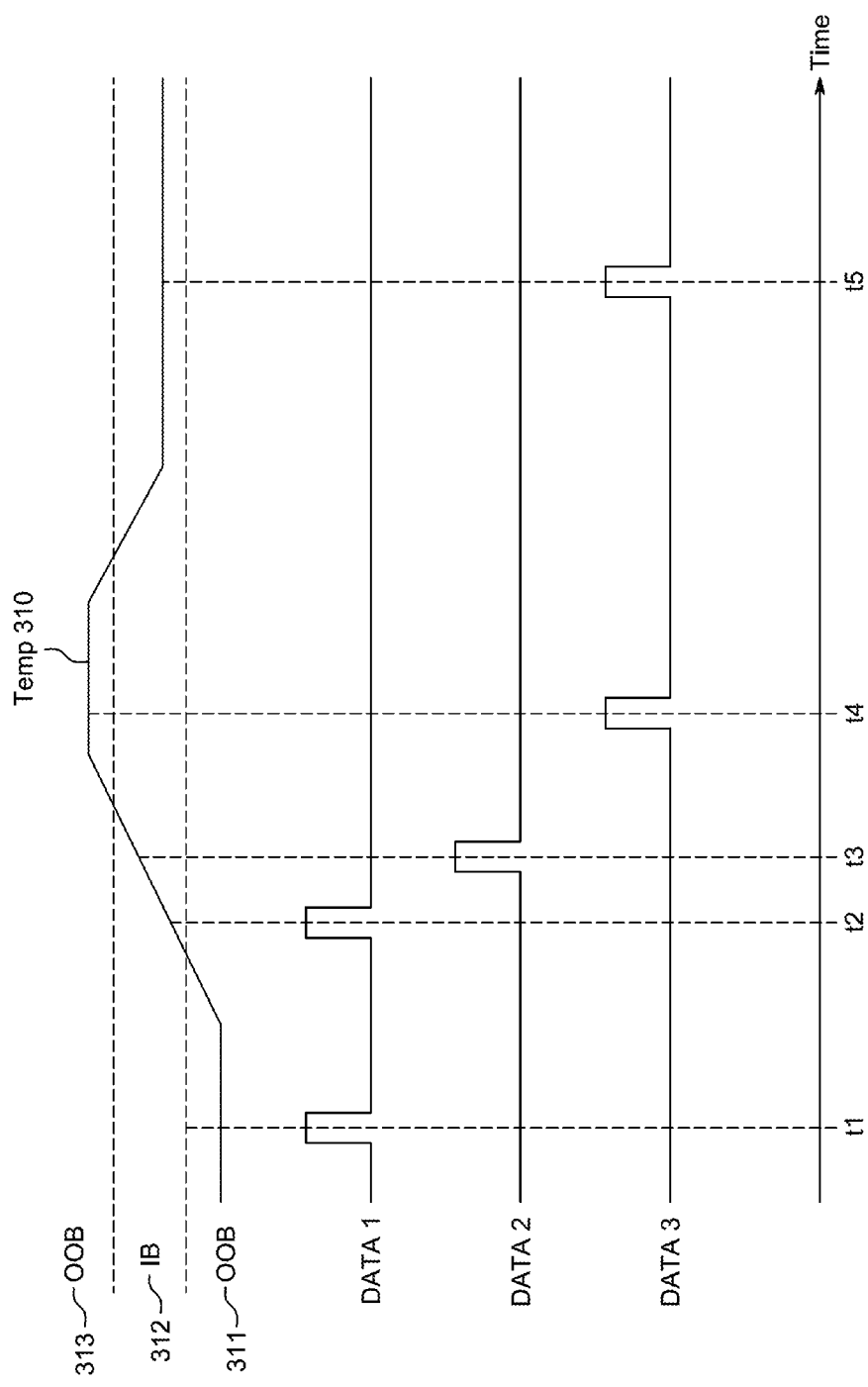
FIG. 3 shows an illustrative timing diagram, according to an embodiment.

FIG. 3 shows an illustrative timing diagram according to an embodiment. In particular, FIG. 3 shows temperature 310 (as obtained from any one of temperature sensors of FIG. 1) changing as a function time, and depicts programming times of data 1, data 2, and data3. Temperature 310 can fall within out-of-bounds (OOB) range 311, in-bounds (TB) range 312, or out-of-bounds (OOB) range 313. The HIGH pulses associated with each of data 1-3 represent times when that data is either initially programmed or re-programmed. The first pulse instance corresponds to an initial programming of that data (e.g., in a particular band), and the second pulse (if any) corresponds to a reprogramming of that data.

At time, t1, data 1 is initially programmed into the non-volatile memory. Data 1 may be programmed in a band of the non-volatile memory, along with metadata indicating that data 1 is associated with OOB range 311. At time, t2, temperature 310 has risen above OOB range 311 and into IB range 312. Circuitry controlling temperature based moves may cause data 1 to be reprogrammed into a different band or portion of the non-volatile memory while the temperature is within IB range 312. This reprogramming is indicated by the second pulse associated with data 1. At time, t2, data 2 is programmed into the non-volatile memory (e.g., another band) and has metadata associating it with IB range 312. Since data 2 was programmed within IB range 312, the control circuitry may determine that there is no reason to perform temperature based moves for data 2, as evidenced by the lack of pulses for the remainder of data 2. At time, t4, data 3 is programmed into the non-volatile memory (e.g., in yet another band) and has metadata associating it with OOB range 313. Data 3 was programmed at a temperature out of bounds, and thus the control circuitry may wait for an appropriate moment to reprogram data 3 so that is associated with IB range 312. Such a moment occurs at time, t5, when temperature 310 has stabilized in TB range 312, and data 3 is reprogrammed.

In some embodiments, data 1 may have been programmed in SLC mode at time, t1, and then reprogrammed in MLC mode at time, t2. Data 2 may be initially programmed in MLC mode at time, t3, since it was within IB range 312 at the time of its initial programming Data 3 may have been programmed in SLC mode at time, t4, and then reprogrammed in MLC mode at time, t5.

The control circuitry responsible for performing temperature based moves may make such moves based on a number of different criteria. The criteria can include, for example, program temperature, margin temperature, current temperature, write count, read disturb factors, and other suitable criteria. Using program temperature as criteria, the control circuitry may determine which bands were programmed at out-of-bounds temperatures and selectively move them to new bands when the current temperature and other factors (e.g., write counts, read disturb, available power, NVM capacity, etc.) are suitable for performing the move. In one embodiment, the control circuitry may establish a queue of bands that need to be moved, and move them when appropriate. The bands may be moved when the current temperature has reached a steady state within the in-bounds temperature range (e.g., such as when data 3 was reprogrammed at time, t5) or while the current temperature is transitioning to a new temperature in the in-bounds temperature range, but has not reached a steady state (e.g., such as when data 1 was reprogrammed at time, t2).

The selection of bands that need to be moved based on temperature may be based on absolute numbers or margin numbers. In absolute terms, any band that was programmed at an out-of-bounds temperature, regardless of how close it was to an in-bounds temperature, will be marked as a band that can be moved. In margin terms, any band that was programmed within a margin portion (such as margin portions 240 and 242 of FIG. 2) may be compared with other criteria to determine whether the data associated with those bands should be moved or held in place. Margin portions 240 and 242 each represent a range of temperature values that straddle the boundaries between in-bounds temperature ranges and out-of-bounds temperature ranges. For example, the control circuitry may let margin programmed bands to remain in place if it determines that cross-temperature swings are relatively rare or non-existent. As another example, the control circuitry may move a margin programmed band (even if it is located within the in-bounds temperature range) if it determines that the device typically operates at temperatures that are relatively distant to the margin temperature (e.g., programmed at margin portion 240, but operates closer to margin portion 242).

The control circuitry may provide threshold shifts for read operations based on the programming temperature. For example, the control circuitry can provide a threshold adjustment based on the program temperature of the band and the read temperature (e.g., current temperature). Such threshold adjustments can improve efficiency of the reads, for example, by reducing error correction computations that may otherwise be required. In another embodiment, the control circuitry can stall performance of a read operation if the current temperature is too far away from the program temperature. When the read operation is stalled, the device may provide a notice to the user that a certain application or data is not available, or it may provide instructions to cool or heat the device.

Figure 4:
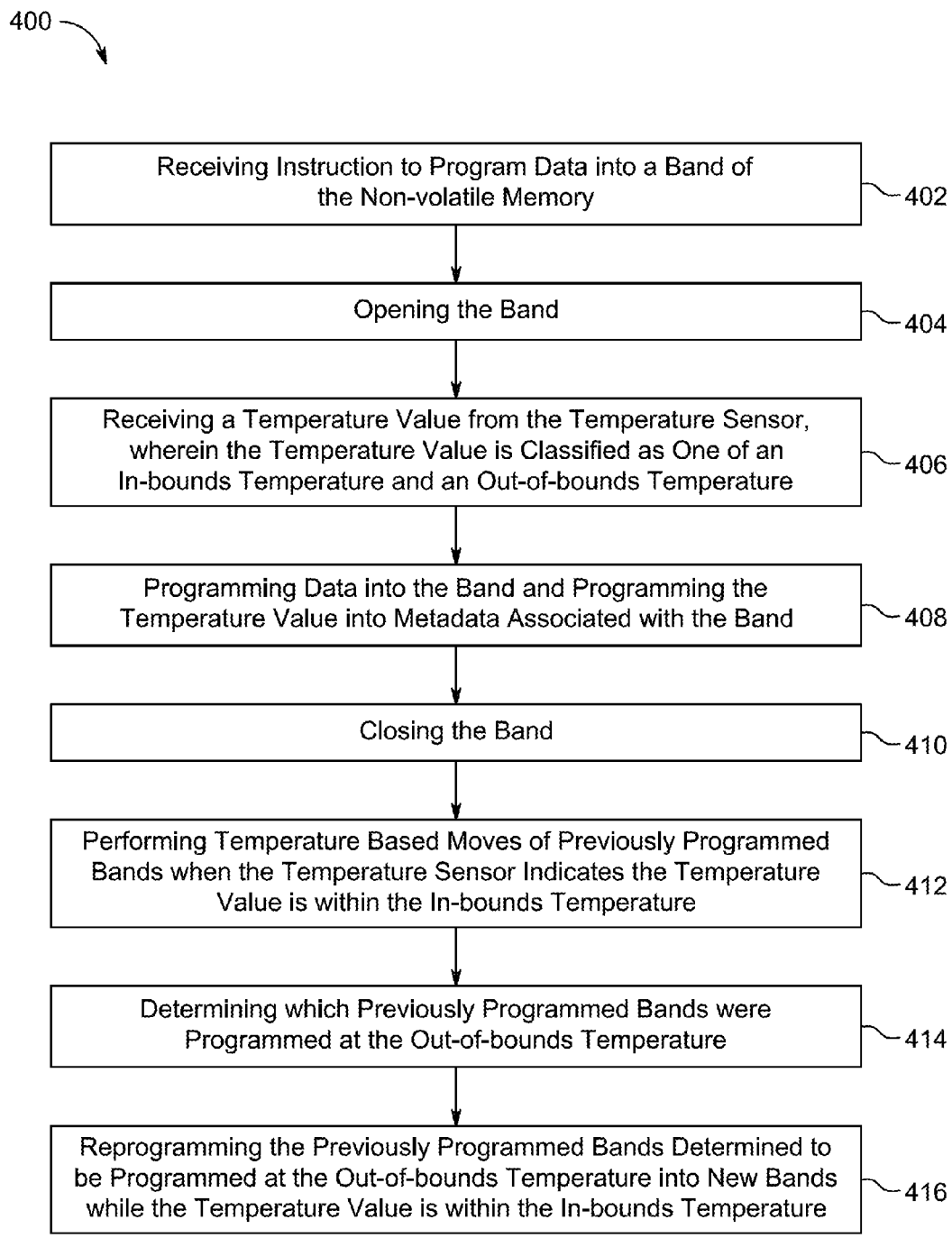
FIG. 4 shows an illustrative flowchart of a process, according to an embodiment.

FIG. 4 shows an illustrative flowchart showing process 400 according to an embodiment. Process 400 may be implemented in a device that has three dimensional non-volatile memory that can be subjected to temperature swings that affect read performance. Process 400 can begin at step 402, where instructions to program data into a band of the non-volatile memory are received. In response to receiving the program instructions, the band may be opened (at step 404) and a temperature value from the temperature sensor can be received (at step 406). The temperature value can be classified as one of an in-bounds temperature and an out-of-bounds temperature. At step 408, the data can be programmed into the band and the temperature value can be stored in metadata associated with that band. The band can be closed at step 410.

At step 412, temperature based moves of previously programmed bands may be performed when the temperature sensor indicates the temperature value is within the in-bounds temperature. At step 414, a determination is made as to which previously programmed bands were programmed at the out-of-bounds temperature, and those band programmed at the out-of-bounds temperature can be reprogrammed into new bands while the temperature value is within the in-bounds temperature (as shown by step 416).

Figure 5:
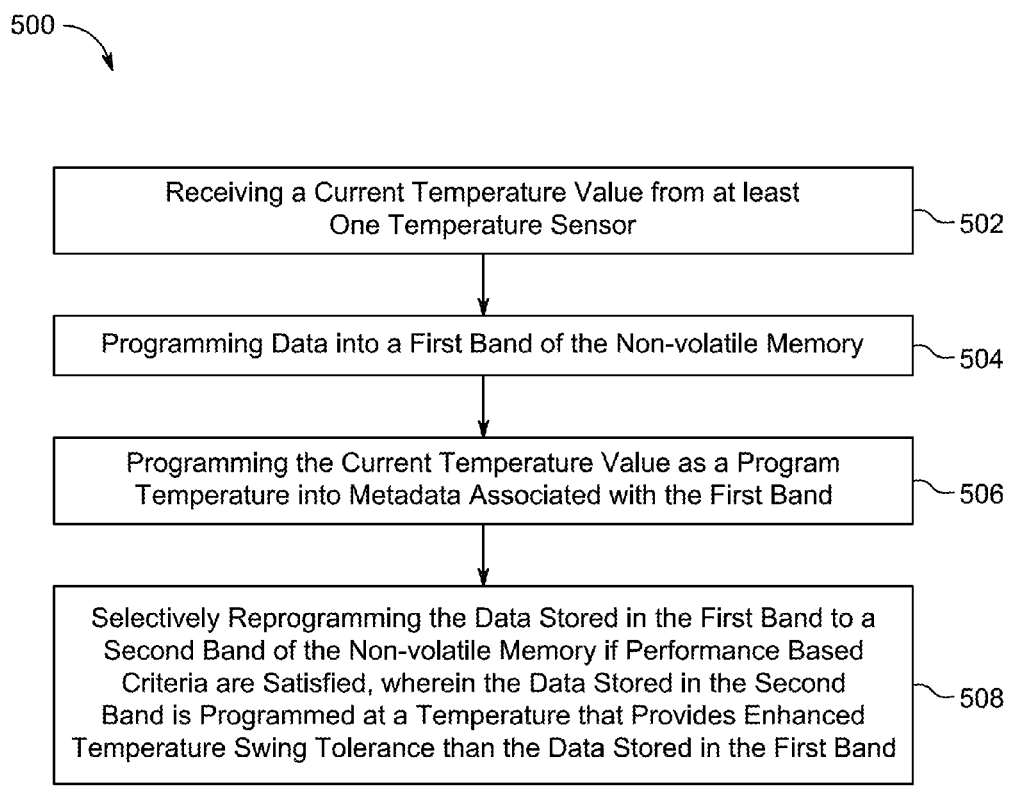
FIG. 5 shows an illustrative flowchart of another process, according to an embodiment.

FIG. 5 shows an illustrative flowchart showing process 500 according to an embodiment. Process 500 may begin at step 502 by receiving a current temperature value from at least one temperature sensor (e.g., any of the temperature sensors in FIG. 1). At step 504, data may be programmed into a first band of the non-volatile memory. At step 506, the current temperature value can be programmed as a program temperature into metadata associated with the first band. At step 508, the data stored in the first band can be selectively reprogrammed to a second band of the non-volatile memory if performance based criteria are satisfied, wherein the data stored in the second band is programmed at a temperature that provides enhanced temperature swing tolerance than the data stored in the first band.

It should be appreciated that the steps shown in FIGS. 4 and 5 are merely illustrative and that additional steps may be added, some steps may be omitted, and the order of the steps can be changed. For example, the bands may be portions of the non-volatile memory that are programmed at a program temperature.

Many alterations and modifications of the preferred embodiments will no doubt become apparent to a person of ordinary skill in the art after having read the foregoing description, it is to be understood that the particular embodiments shown and described by way of illustration are in no way intended to be considered limiting. Thus, references to the details of the described embodiments are not intended to limit their scope.

What is claimed is:

1. A system, comprising non-volatile memory, a temperature sensor; and control circuitry configured to:
   receive an instruction to program data into a band of the non-volatile memory, wherein in response to the received instruction, the control circuitry is configured to:
      open the band;
      receive a temperature value from the temperature sensor, wherein the temperature value is classified as one of an in-bounds temperature and an out-of-bounds temperature;
      program the data and the temperature value into the band; and
      close the band; and
   perform temperature-based moves of previously programmed bands when the temperature sensor indicates the temperature value is within the in-bounds temperature, wherein the temperature-based moves include:

determine which previously programmed bands were programmed at the out-of-bounds temperature; and reprogram the previously programmed bands determined to be programmed at the out-of-bounds temperature into new bands while the temperature value is within the in-bounds temperature.

2. The system of claim 1, wherein the non-volatile memory comprises three dimensional (3-D) Nand.

3. The system of claim 1, wherein the control circuitry is configured to:

receive a read instruction to read data out of the non-volatile memory, wherein in response to the received read instruction, the control circuitry is further configured to:

receive a current temperature value:

select a band to read;

determine the temperature value of the selected band;

commence a read operation of the selected band if the determined temperature value is within a fixed range of the current temperature; and prevent the read operation of the selected band if the determined temperature value is not within the fixed range of the current temperature.

4. The system of claim 1, wherein the system is subjected to temperature swings that cause the temperature values to cycle between the in-bounds and out-of-bounds temperatures.

5. The system of claim 4, wherein the temperature swing is at least 50 degrees centigrade.

6. The system of claim 1, wherein the out-of-bounds temperature represents first and second ranges of temperatures, wherein the first range represents temperature values below the in-bounds temperature, and wherein the second range represents temperature values above the in-bounds temperature.

7. The system of claim 1, wherein the temperature sensor is a first of a plurality of temperature sensors, wherein the first temperature sensor is associated with one of the non-volatile memory and the control circuitry.

8. The system of claim 1, wherein the control circuitry is configured to balance a total number of program operations with the temperature-based moves.

9. The system of claim 1, wherein the control circuitry is operative to:

program data in a single level cell mode when the data is initially programmed into a band; and program data in a multi-level cell mode when performing a temperature based move.

10. A method for managing temperature-based moves of data stored in non-volatile memory, comprising:

receiving a current temperature value from at least one temperature sensor;

programming data into a first band of the non-volatile memory;

programming the current temperature value as a program temperature into metadata associated with the first band; and selectively reprogramming the data stored in the first band to a second band of the non-volatile memory if performance based criteria are satisfied, wherein the data stored in the second band is programmed at a temperature that provides enhanced temperature swing tolerance than the data stored in the first band.

11. The method of claim 10, wherein the performance based criteria comprises the program temperature and the current temperature.

12. The method of claim 11, wherein the program temperature is classified as one of an in-bounds temperature and an out-of-bounds temperature.

13. The method of claim 12, wherein the in-bounds temperature represents a range of temperatures in which data is programmed into the non-volatile memory and still be accurately read even if the read operation is performed at an out-of-bounds temperature.

14. The method of claim 12, wherein the out-of-bounds temperature represents a range of temperatures in which data is programmed into the non-volatile memory and potentially experience read errors if a read operation is performed when a temperature delta between the out-of-bounds temperature and the read temperature exceeds a threshold.

15. The method claim 12, wherein the selectively reprogramming comprises:

determining that the first band was programmed at the out-of-bounds temperature; and reprogramming the data stored in the first band to the second band when the current temperature is within a range associated with the in-bounds temperature.

16. The method claim 12, wherein the selectively reprogramming comprises:

determining that the first band was programmed at the in-bounds temperature; and allowing the data stored in the first band to remain stored in the first band.

17. A method for managing temperature based moves of data stored in three-dimensional non-volatile memory (NVM), the method implemented in a device that is subjected to temperature swings that can affect read performance, the method comprising:

monitoring a current temperature;

programming a plurality NVM portions with data, wherein each NVM portion includes metadata specifying a program temperature into a first band of the non-volatile memory, wherein the program temperature is classified as one of an in-bounds temperature and an out-of-bounds temperature;

determining which of the plurality of NVM portions were programmed at the out-of-bounds temperature; and reprogramming the NVM portions determined to have been previously programmed at the out-of-bounds temperature into new bands while the current temperature is within the in-bounds temperature.

18. The method of claim 17, further comprising determining that the current temperature has been maintained in a steady state before reprogramming the NVM portions determined to have been previously programmed at the out-of-bounds temperature into new bands while the current temperature is within the in-bounds temperature.

19. The method of claim 17, wherein the NVM portions programmed within the in-bounds temperature are readable regardless of the temperature swings, and wherein the NVM portions programmed within the out-of-bounds temperatures are not always readable due to the temperature swings.

* * * * *

UNITED STATES PATENT AND TRADEMARK OFFICE
CERTIFICATE OF CORRECTION

PATENT NO. : 9,891,859 B1  Page 1 of 1
APPLICATION NO. : 15/232253
DATED : February 13, 2018
INVENTOR(S) : Andrew W. Vogan et al.

It is certified that error appears in the above-identified patent and that said Letters Patent is hereby corrected as shown below:

In the Claims

Column 12, Claim 13, Lines 12-13, delete "an out-of-bounds temperature" and insert -- the out-of-bounds temperature --, therefor.

Column 12, Claim 14, Line 19, delete "the read temperature" and insert -- a read temperature --, therefor.

Column 12, Claim 15, Line 20, delete "The method claim" and insert -- The method of claim --, therefor.

Column 12, Claim 16, Line 27, delete "The method claim" and insert -- The method of claim --, therefor.

Signed and Sealed this
Eighth Day of May, 2018

Andrei Iancu
*Director of the United States Patent and Trademark Office*